United States Patent [19]

Knierim

[11] Patent Number: 5,677,647

[45] Date of Patent: Oct. 14, 1997

[54] HIGH POWER PULSE WAVEFORM GENERATOR

[75] Inventor: David L. Knierim, Wilsonville, Oreg.

[73] Assignee: Tektronix, Inc., Wilsonville, Oreg.

[21] Appl. No.: 546,242

[22] Filed: Oct. 20, 1995

[51] Int. Cl.[6] .................................................. H03F 3/26
[52] U.S. Cl. .......................................... 330/263; 330/264
[58] Field of Search .............................. 327/318, 321,
327/325; 330/263, 264, 265, 267

[56] References Cited

U.S. PATENT DOCUMENTS

| | | | |
|---|---|---|---|
| 3,569,847 | 3/1971 | Adams | 330/263 X |
| 4,293,875 | 10/1981 | Katz | 330/263 X |
| 5,210,506 | 5/1993 | Koch et al. | 330/264 X |

*Primary Examiner*—Steven Mottola

[57] ABSTRACT

A high power pulse waveform generator for amplifying an input pulse signal has an a.c. coupled amplifier with d.c. negative feedback. An output stage of the a.c. coupled amplifier has a pair of opposite polarity, high power transistors coupled in series between a high power voltage source and a reference power rail, such as ground, with the junction between the transistors being an output terminal. An input stage receives the input pulse signal and provides a bias during a quiescent state of the input pulse signal to the output stage so that the output terminal is clamped to the reference power rail regardless of any d.c. offset in the input pulse signal. The input stage a.c. couples the pulse of the input pulse signal to the output stage to provide the high power pulse waveform at the output terminal. The output terminal is d.c. coupled to the input terminal to provide negative feedback so that the shape of the high power pulse waveform follows the shape of the input pulse signal.

12 Claims, 2 Drawing Sheets

HIGH POWER PULSE WAVEFORM GENERATOR

BACKGROUND OF THE INVENTION

The present invention relates to electrical waveform generation, and more particularly to a high power pulse waveform generator where the high power pulses have a controllable shape and return to a power rail between pulses.

In many applications, such as head drivers for piezoelectric inkjet printers, shaped high power pulses are required to drive a variable capacitive load. These pulses need to retain their accurate waveform over a wide range of capacitive values. A conventional approach is to use a d.c. coupled amplifier to amplify a low power pulse. To drive the output to a quiescent level of zero volts between pulses, such an amplifier requires a positive and a negative voltage rail. D.c. offset voltages of both the amplifier and low power pulse source must be accurate to provide an accurate d.c. level at the output. High voltage d.c. coupled amplifiers require more expensive internal level shifting circuitry. Also such amplifiers require significant power because of the requirement of two opposing voltage rails about zero.

What is desired is an amplifier for generating high power pulse waveforms that return to a reference power rail and that have a controllable shape.

SUMMARY OF THE INVENTION

Accordingly the present invention provides a high power pulse waveform generator in the form of an a.c. coupled amplifier with d.c. coupled negative feedback. The amplifier has an output stage with a pair of MOSFET output transistors coupled in series between a high power voltage rail and a reference power rail, with the output being taken at the junction between the two transistors. A bias circuit, which may be part of an input stage, provides a current imbalance when an input signal is in a quiescent state (no pulse) such that the transistor coupled to the reference power rail in the output stage is saturated on. When the input signal is pulsed, the input stage reverses the current imbalance during the initial transition to turn on the other transistor while turning off the first transistor. The d.c. coupled negative feedback between the output and input of the amplifier assures that the high power pulse waveform at the output follows the shape of the input pulse signal. A.c. coupling within the input stage eliminates any d.c. offset in the input pulse signal from appearing in the high power pulse waveform. A.c. coupling between the input stage and at least one output transistor also provides inexpensive level shifting.

The objects, advantages and other novel features of the present invention are apparent from the following detailed description when read in conjunction with the claims and attached drawing.

DESCRIPTION OF THE PREFERRED EMBODIMENT

Figure 1:
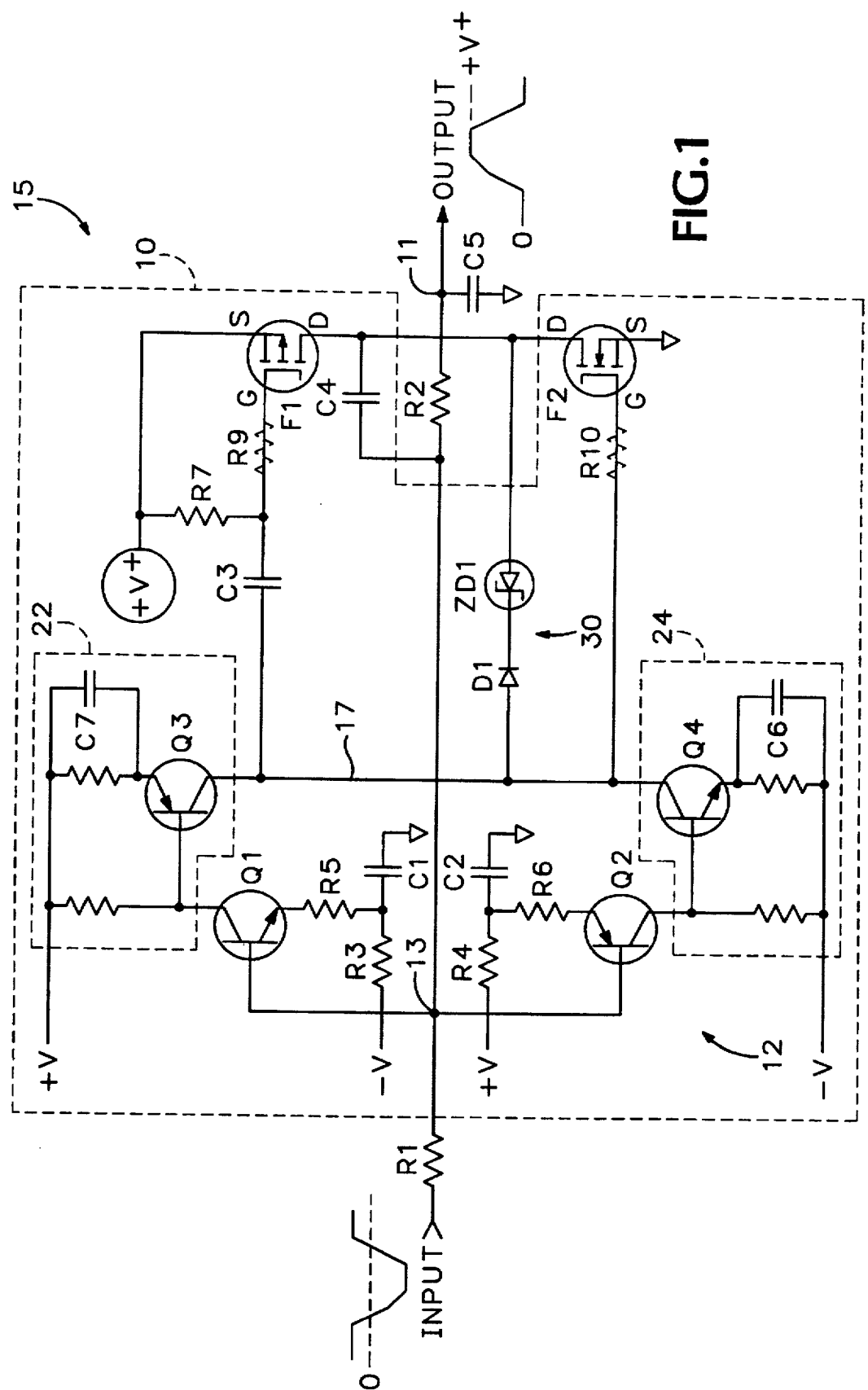
FIG. 1 is a schematic diagram of a high power pulse waveform generator according to the present invention.

Referring now to FIG. 1 a pulse input signal is applied via an input resistor R1 to an input stage 12 of an a.c. coupled amplifier 10 that provides a high power pulse waveform at an output 11. The input stage 12 includes transistors Q1–Q4 and their associated circuitry. Transistors Q3, Q4 and associated circuitry form respective gain current mirrors 22, 24 for the input transistors Q1, Q2. The collectors of transistors Q3, Q4 are coupled together to form an output node 17 for the input stage 12. Bias for the input transistors Q1, Q2 are provided by respective series resistors R3, R5 and R4, R6 coupled between respective opposite polarity voltage rails +V, –V and their corresponding emitters. A.c. coupling capacitors C1, C2 are coupled from the junctions of the respective series resistors to a reference power rail, such as ground. The relative values of resistors R3, R4 are determined according to the amount of d.c. offset that is expected in the input signal, as is explained more fully later. Also coupled between the collectors of transistors Q3, Q4 and the amplifier output 11 is a diode clamp circuit 30 in the form of a diode D1 and a zener diode ZD1 coupled in series opposition.

The amplifier output 11 is taken from the junction between two serially connected, opposite polarity MOSFET transistors F1, F2 in an output stage 15 of the amplifier 10. The output 11 also is d.c. coupled to the input 13 via resistor R2 to provide negative feedback. MOSFET F2 has its source coupled to the reference power rail, and MOSFET F1 has its source coupled to a high voltage rail +V$^+$. A resistor R7 is coupled between the source and gate of MOSFET F1. The gate of MOSFET F1 also is connected through an a.c. coupling capacitor C3 to the output node 17, i.e., at the collectors of transistors Q3, Q4, while the gate of MOSFET F2 is coupled directly to the output node 17. Resistor R7 and capacitor C3 provide a.c. coupled level shifting to drive the MOSFET F1, with the MOSFET being biased to be off in the quiescent state of the amplifier 10. An output capacitor C5 coupled between the output 11 and the reference power rail provides a minimum output load capacitance to maintain loop stability. Capacitor C4 coupled across feedback resistor R2, together with capacitors C6, C7 in the respective gain current mirror circuits 22, 24, provide high frequency peaking to also improve loop stability. Optional gate resistors R9, R10 may be included in the respective gate circuits of the MOSFETs F1, F2 to damp any oscillations that may occur in those transistors.

In operation when the input signal is at a quiescent level prior to a pulse, the values of resisters R3, R4 are such that slightly more current flows through R3 than R4. The values for resisters R3, R4 depend on the approximate quiescent voltage of the low power input pulse signal. As a result transistor Q3 conducts harder than transistor Q4, and the voltage at the collector of Q3 is pulled towards the current mirror voltage rail +V. The diode clamp circuit 30 limits the maximum voltage at the collector of Q3 to a value that is sufficient to cause MOSFET F2 to saturate, thus clamping the output of the amplifier 10 to the reference power rail. The diode clamp circuit 30 prevents transistor Q3 from saturating, and keeps a sufficiently low voltage on the gate of MOSFET F2 so that the MOSFET turns off before MOSFET F1 conducts appreciable current at the beginning of the input pulse. As the input signal changes from the quiescent state at the beginning of the pulse signal, resistor R4 begins to conduct slightly more current than resistor R3 which causes the voltage at the collectors of transistors Q3, Q4 to decrease, turning off MOSFET F2 and turning on MOSFET F1. Since resistor R2 feeds back the output to the input of the amplifier 10, the shape of the output signal follows the shape of the input signal. When the pulse signal reaches a peak, the currents through transistors Q3, Q4 are in balance. Then when the pulse begins to return to its original quiescent state, transistor Q3 draws slightly more current than transistor Q4 until MOSFET F1 turns off and MOSFET F2 turns on. As the input pulse signal returns to the quiescent level, transistor Q3 drives MOSFET F2 into saturation to clamp the output at the ground rail again.

Figure 2:
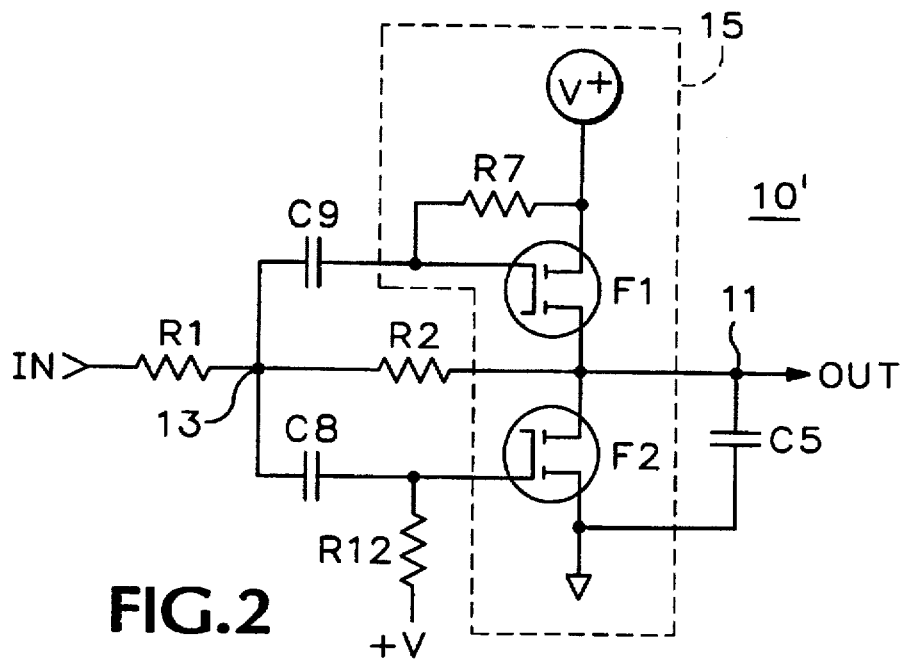
FIG. 2 is a simplified schematic diagram of an alternate embodiment of the high power pulse waveform generator according to the present invention.
Figure 3:
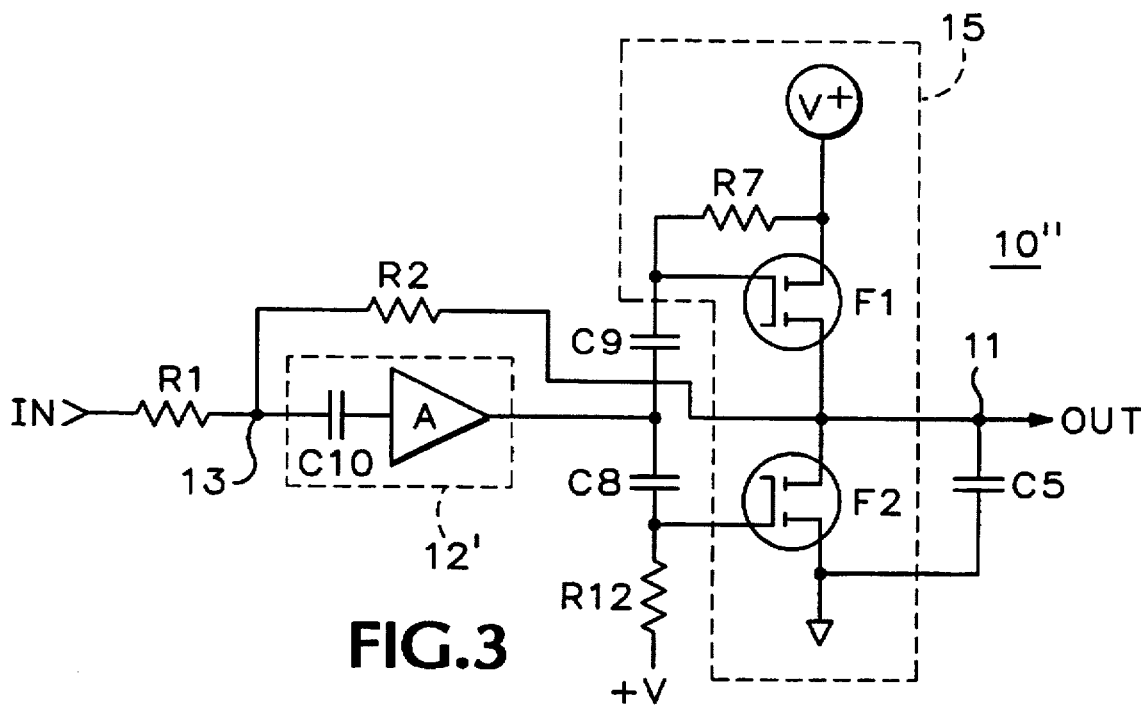
FIG. 3 is a simplified schematic diagram of another alternate embodiment of the high power pulse waveform generator according to the present invention.

FIGS. 2 and 3 show alternative embodiments of the a.c. coupled amplifier 10', 10" which each use a.c. coupling to the output MOSFETs F1, F2 together with d.c. coupled feedback from the output 11 to the input 13 via resistor R2. In FIG. 2 the input pulse signal is coupled via the input resistor R1 and respective a.c. coupling capacitors C8, C9 directly to the output stage 15, i.e., to the gates of the MOSFETs F1, F2. A bias resistor R12 coupled between the gate of MOSFET F2 and a bias voltage rail +V provides the necessary bias to clamp the output to the reference power rail via MOSFET F2 during the quiescent state of the input pulse signal. In FIG. 3 an input amplifier A and a.c. coupling capacitor C10 are coupled in series between the input 13 and the output stage 15 to form an input stage 12' for the circuit of FIG. 2.

Thus the present invention provides an a.c. coupled amplifier with d.c. feedback for generating high power pulse waveforms with controllable shape and which return to the reference power rail.

What is claimed is:

1. An a.c. coupled amplifier with d.c. feedback for generating a high power pulse waveform in response to an input pulse signal applied to an input terminal comprising:

an output stage coupled between a high power voltage rail and a reference power rail that produces the high power pulse waveform at an output terminal;

means for a.c. coupling the input pulse signal to the output stage for amplification by the output stage;

means for biasing the output stage so that the output terminal is clamped to the reference power rail when the input pulse signal is in a quiescent state; and means for d.c. coupling the output terminal to the input terminal to provide negative feedback so that the shape of the high power pulse waveform follows the shape of the input pulse signal.

2. The amplifier as recited in claim 1 wherein the output stage comprises a pair of opposite polarity, high power transistors coupled in series between the high voltage and reference power rails, a gate terminal of each transistor being coupled to the a.c. coupling means to receive the input pulse signal and a junction between the transistors being coupled to the output terminal.

3. The amplifier as recited in claim 2 wherein the biasing means comprises a resistor coupled between the gate of the one transistor coupled to the reference power rail and a bias voltage source so that the one transistor conducts when the input power pulse is in the quiescent state to clamp the output terminal to the reference power rail.

4. The amplifier as recited in claim 1 further comprising an input amplifier stage coupled between the input terminal and the a.c. coupling means.

5. The amplifier as recited in claim 4 wherein the input stage comprises:

an a.c. coupling capacitor coupled at one end to the input terminal; and an input amplifier coupled between the a.c. coupling capacitor and the a.c. coupling means such that the input pulse signal from the input terminal is coupled to the a.c. coupling means.

6. An amplifier for generating a high power pulse waveform in response to an input pulse signal comprising:

an output stage coupled between a high power voltage rail and a reference power rail that produces the high power pulse waveform at an output terminal;

an input amplifier stage coupled to receive the input pulse signal at an input terminal and to a.c. couple the input pulse signal to the output stage, the amplifier input stage providing bias for the output stage so that the output terminal is clamped to the reference power rail when the input pulse signal is in a quiescent state; and means for d.c. coupling the output terminal to the input terminal to provide negative feedback so that the shape of the high power pulse waveform follows the shape of the input pulse signal.

7. The amplifier as recited in claim 6 wherein the output stage comprises a pair of opposite polarity, high power output transistors coupled in series between the high voltage and reference power rails, a gate terminal of each transistor being coupled to an output from the input amplifier stage to receive the input pulse signal and a junction between the output transistors being coupled to the output terminal.

8. The stage amplifier as recited in claim 6 wherein the input stage comprises:

a pair of opposite polarity input stage amplifiers having input terminals coupled to the input terminal of the input stage and having output terminals coupled together;

means for a.c. coupling the output terminals to the output stage; and means for biasing the pair of opposite polarity input amplifiers so that the output terminals provide the bias for the output stage when the input pulse signal is in the quiescent state to clamp the output terminal of the output stage to the reference power rail.

9. The amplifier as recited in claim 8 wherein the biasing means comprises respective current sources for the pair of input amplifiers, the current sources being configured to provide a bias voltage at the output terminals so that the output stage is biased to clamp the output terminal to the reference power rail when the input pulse signal is in the quiescent state.

10. An amplifier comprising:

a pair of opposite polarity input amplifiers, each having an input coupled together to form an input terminal for receiving an input pulse signal and each having an output coupled together;

means for biasing each input amplifier such that when the input pulse signal is in a quiescent state one amplifier outputs slightly more current than the other;

a pair of opposite polarity, high power transistors coupled in series between a high power voltage rail and a reference power rail, a gate terminal for each transistor being coupled to the outputs of the opposite polarity input amplifiers and a junction between the two transistors being coupled to an output terminal to provide a high power pulse waveform signal;

means for a.c. coupling the outputs of the input amplifiers to the gate of the transistor coupled to the high voltage rail; and means for d.c. coupling the output terminal to the input terminal to provide negative feedback.

11. The amplifier as recited in claim 10 further comprising means coupled between the output terminal and the outputs of the input amplifiers for limiting the voltage at the outputs of the input amplifiers to prevent over saturation of the input amplifiers.

12. The amplifier as recited in claim 11 further comprising means coupled between the outputs of the input amplifiers and the gates of the transistors for damping oscillations in the transistors.

* * * * *